(12) United States Patent
Ogata et al.

(10) Patent No.: US 8,853,664 B2
(45) Date of Patent: Oct. 7, 2014

(54) ORGANIC ELEMENT AND ORGANIC DEVICE INCLUDING THE SAME

(75) Inventors: Hidenori Ogata, Osaka (JP); Yoshimasa Fujita, Osaka (JP); Mitsuhiro Koden, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 20 days.

(21) Appl. No.: 13/387,332

(22) PCT Filed: Apr. 13, 2010

(86) PCT No.: PCT/JP2010/002667
§ 371 (c)(1), (2), (4) Date: Jan. 26, 2012

(87) PCT Pub. No.: WO2011/013275
PCT Pub. Date: Feb. 3, 2011

(65) Prior Publication Data
US 2012/0126218 A1 May 24, 2012

(30) Foreign Application Priority Data
Jul. 28, 2009 (JP) .................................. 2009-175720

(51) Int. Cl.
| | | |
|---|---|---|
| *H01L 47/00* | (2006.01) | |
| *H01L 51/40* | (2006.01) | |
| *H05B 33/10* | (2006.01) | |
| *H01L 51/52* | (2006.01) | |
| *H01L 51/00* | (2006.01) | |

(52) U.S. Cl.
CPC ............ *H01L 51/5203* (2013.01); *H05B 33/10* (2013.01); *H01L 51/0085* (2013.01); *H01L 51/006* (2013.01)
USPC ................................................ 257/4; 438/99

(58) Field of Classification Search
CPC . H01L 45/04; H01L 27/3244; H01L 51/0545; Y02E 10/50; B82Y 10/00
USPC ............... 257/4, E51.018, E51.012, E51.003; 438/99
See application file for complete search history.

(56) References Cited

U.S. PATENT DOCUMENTS

| | | | |
|---|---|---|---|
| 6,579,422 B1 | 6/2003 | Kakinuma | |
| 7,712,676 B2 * | 5/2010 | Yukawa et al. | ............... 235/492 |

(Continued)

FOREIGN PATENT DOCUMENTS

| | | |
|---|---|---|
| JP | 2001-118674 | 4/2001 |
| JP | 2002-93574 | 3/2002 |

(Continued)

OTHER PUBLICATIONS

Sugimoto, A. et al., "Development of a Film-type Organic ELectroluminescent (OEL) Display," *Pioneer R&D* 11(3):48-56. (17 pages).

(Continued)

*Primary Examiner* — Fernando L Toledo
*Assistant Examiner* — Neil Prasad
(74) *Attorney, Agent, or Firm* — Morrison & Foerster LLP

(57) ABSTRACT

An organic electric-field element includes an elongated support base member, a first electrode provided on the support base member, an organic layer provided to cover the first electrode, and a second electrode provided to cover the organic layer. At one end portion of the support base member, a two-layer structure region including the support base member and the first electrode is provided, and a three-layer structure region including the support base member, the first electrode, and the organic layer is provided, extending continuously from the other end of the two-layer structure region. At the other end portion of the support base member, a two-layer structure region including the support base member and the second electrode is provided, and a three-layer structure region including the support base member, the second electrode, and the organic layer is provided, extending continuously from one end of the two-layer structure region.

16 Claims, 4 Drawing Sheets

(56) References Cited

U.S. PATENT DOCUMENTS

| | | |
|---|---|---|
| 2006/0153971 A1 | 7/2006 | Takehara |
| 2007/0188093 A1* | 8/2007 | Nagara et al. ............ 313/512 |
| 2009/0038683 A1 | 2/2009 | Walter et al. |
| 2009/0114905 A1* | 5/2009 | Ottermann et al. ......... 257/40 |
| 2011/0186822 A1* | 8/2011 | Adachi ....................... 257/40 |
| 2011/0237006 A1* | 9/2011 | Sarfert et al. ............... 438/26 |

FOREIGN PATENT DOCUMENTS

| | | |
|---|---|---|
| JP | 2005-321433 | 11/2005 |
| JP | 2006-196298 | 7/2006 |
| JP | 2007-220402 | 8/2007 |
| JP | 2008-10243 | 1/2008 |
| JP | 2009-26650 | 2/2009 |
| JP | 2009-516382 | 4/2009 |
| WO | WO-01/05194 | 1/2001 |

OTHER PUBLICATIONS

International Search Report mailed Jun. 29, 2010, directed to International Application No. PCT/JP2010/002667; 5 pages.

* cited by examiner

FIG.3
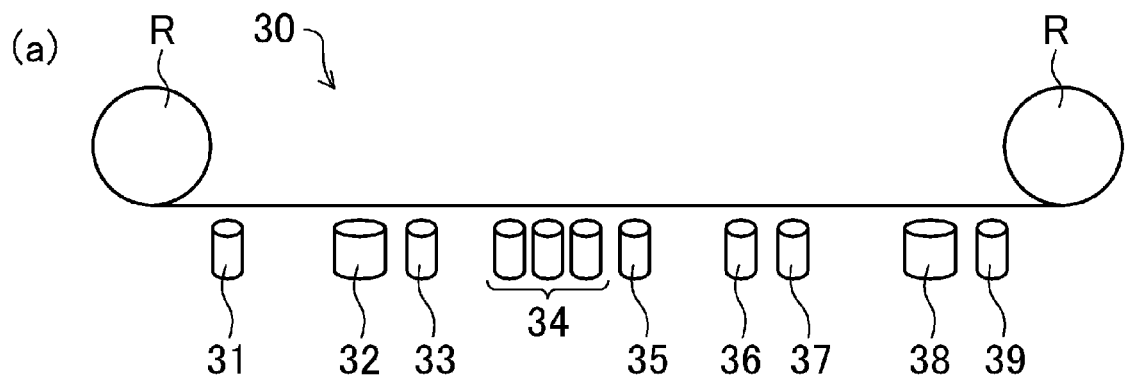
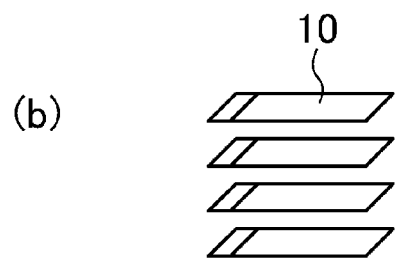
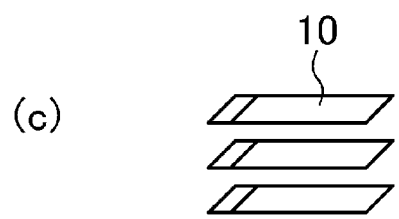
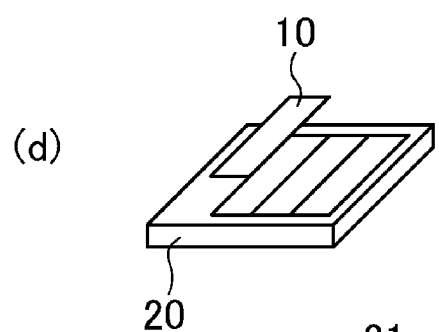
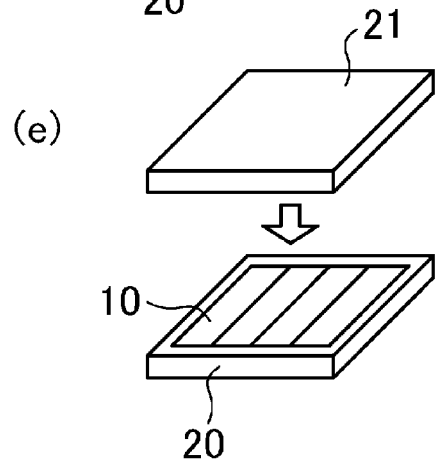

ORGANIC ELEMENT AND ORGANIC DEVICE INCLUDING THE SAME

REFERENCE TO RELATED APPLICATIONS

This application is the national stage under 35 USC 371 of International Application No. PCT/JP2010/002667, filed Apr. 13, 2010, which claims the priority of Japanese Patent Application No. 2009-175720, filed Jul. 28, 2009, the entire contents of which are incorporated herein by reference.

FIELD OF THE INVENTION

The present invention relates to organic elements, organic devices including organic elements, and method for manufacturing these elements and devices, and more particularly, to organic EL elements, organic photovoltaic cell elements, organic field-effect transistor elements, organic EL devices including these elements, organic photovoltaic cells, and organic field-effect transistors.

BACKGROUND OF THE INVENTION

In recent years, these electronic devices made of organic materials have been actively studied. These electronic devices (organic electronic devices) can be mounted on flexible and large-area substrates and can be manufactured in a low-temperature process at low cost, for example. These advantages over conventional electronic devices made of inorganic materials are expected to realize, for example, practical flexible displays etc.

Examples of the organic electronic device includes organic electroluminescent (hereinafter referred to as "organic EL") device, organic photovoltaic cells, and organic field-effect transistors (organic FETs), etc.

The organic EL device includes an organic EL element in which an organic layer containing a luminescent material is interposed between a pair of electrodes. The organic EL element has characteristics, such as low voltage drive, high luminance, light emission capability, etc., and therefore, can have a smaller thickness and a lower weight. The organic EL device is applicable to a light source for a photocopier and a printer, etc., and an illuminating device in addition to a display. For example, an organic EL illuminating device has a number of advantages, such as surface emission, smaller thickness, ease of dimming control, etc. While fluorescent lamps contain mercury, which puts a load on the environment, the organic EL illuminating device is free from such a problem.

As a technique of mass-producing an organic EL element at low cost, there is a known manufacturing technique of forming an electrode and an organic layer, etc. on a flexible substrate, such as resin film etc., by roll-to-roll processing (e.g., PATENT DOCUMENT 1).

In roll-to-roll processing, the substrate is conveyed intermittently or continuously during or between each production step, such as electrode formation, organic layer formation, etc., to form an electrode and an organic layer, whereby the time required for the production step can be shortened and the size of the device can be reduced.

In general, flexible substrates made of resin film etc. transmit moisture and oxygen more easily than glass substrates. Therefore, if the organic electric-field element is exposed to the atmosphere, the organic electric-field element is likely to be degraded due to moisture and oxygen, etc.

PATENT DOCUMENT 2 and NON-PATENT DOCUMENT 1 describe organic EL elements including a flexible film substrate, in which a barrier layer made of an oxide or nitride of silicon or aluminum, etc. is provided on a surface of the substrate to enhance the gas barrier properties of the substrate.

PATENT DOCUMENT 3 describes an organic EL element including a flexible film substrate, in which the organic EL element is encapsulated by a glass substrate and a moisture-resistant film to reduce or prevent external moisture which enters the organic EL element.

CITATION LIST

Patent Documents

PATENT DOCUMENT 1: International Publication WO2001/005194

PATENT DOCUMENT 2: Japanese Patent Publication No. 2001-118674

PATENT DOCUMENT 3: Japanese Patent Publication No. 2002-93574

Non-Patent Documents

NON-PATENT DOCUMENT 1: "Development of Organic Film Display," PIONEER R&D, Vol. 11, No. 3

SUMMARY OF THE INVENTION

Incidentally, when an organic layer and an electrode are formed by roll-to-roll processing, patterning is required, which is performed by employing a photolithography technique, a wet etching technique, or a vapor deposition mask technique, etc. However, in these methods, it is necessary to produce a metal mask etc. serving as a photomask or a deposition mask, resulting in an increase in manufacturing cost. It is also necessary to provide different masks corresponding to different patterns of electrodes and organic layers to be formed, and switch these masks, depending on the formation steps, resulting in a decrease in productivity.

The present invention provides an organic electric-field element which can be manufactured more simply by a method which does not require a mask, and an organic electronic device including the organic electric-field element.

An organic electric-field element according to the present invention includes an elongated support base member, a first electrode provided on the support base member, an organic layer provided to cover the first electrode, and a second electrode provided to cover the organic layer. At one end portion of the support base member, a two-layer structure region including the support base member and the first electrode is provided, and a three-layer structure region including the support base member, the first electrode, and the organic layer is provided, extending continuously from the other end of the two-layer structure region. At the other end portion, of the support base member, a two-layer structure region including the support base member and the second electrode is provided, and a three-layer structure region including the support base member, the second electrode, and the organic layer is provided, extending continuously from one end of the two-layer structure region.

With this configuration, at one end portion of the support base member, a two-layer structure region including the support base member and the first electrode is provided, and a three-layer structure region including the support base member, the first electrode, and the organic layer is provided, extending continuously from the other end of the two-layer structure region. At the other end portion of the support base member, a two-layer structure region including the support base member and the second electrode is provided, and a three-layer structure region including the support base member, the second electrode, and the organic layer is provided, extending continuously from one end of the two-layer structure region. The first electrode, the organic layer, and the second electrode each have a rectangular pattern having a width which is equal to the width of the support base member and a predetermined length in the length direction of the support base member. Therefore, complicated patterning is not required for formation of the first electrode, the organic layer, and the second electrode. Therefore, each formation step only requires forming a formation film on an entire surface and then etching the formation film without using a mask. Thus, the organic electric-field element can be easily manufactured.

In this case, the support base member may be made of a flexible material.

With this configuration, the support base member is made of a flexible material. Therefore, the organic electron element can be used to provide an organic electronic device having a shape other than a planar plate-like shape, resulting in a greater quality and diversity of design.

The support base member and the first electrode are preferably made of an optically transparent material.

An organic electronic device according to the present invention includes a plurality of the organic electric-field elements. The organic electric-field elements are provided and encapsulated between a pair of substrates facing each other.

With this configuration, the plurality of organic electric-field elements of the organic electronic device are provided and encapsulated between the pair of substrates. Therefore, even if each organic electric-field element does not have a gas barrier mechanism, the encapsulation by the pair of substrates can reduce or prevent external gas (e.g., oxygen etc.) which enters the organic electric-field element. Because a gas barrier mechanism does not have to be provided in each organic electric-field element, the cost can be reduced.

In this case, at least one of the pair of substrates is preferably made of an optically transparent material.

In the organic electronic device of the present invention, the plurality of organic electric-field elements may be attached to one of the pair of substrates with the second electrodes thereof contacting the one of the pair of substrates. Alternatively, the plurality of organic electric-field elements may be attached to one of the pair of substrates with the support base members thereof contacting the one of the pair of substrates.

In the organic electronic device of the present invention, a space formed between the pair of substrates may be filled with a heat dissipating resin having a higher heat conductivity than that of the air.

The organic electric-field element of the present invention may be an organic photovoltaic cell element whose organic layer is an optical absorption layer. The organic electronic device of the present invention may be an organic photovoltaic cell including the organic photovoltaic cell element.

The organic electric-field element of the present invention may be an organic field-effect transistor element whose organic layer is an organic semiconductor layer. The organic electronic device of the present invention may be an organic field-effect transistor including the organic field-effect transistor element.

A method for manufacturing the organic electric-field element of the present invention includes a first electrode formation step of forming a first electrode formation film on an entire surface of a support base member, and then performing patterning on the first electrode formation film by etching to form a first electrode, an organic layer formation step of forming an organic layer formation film on an entire surface of the support base member to cover the first electrode formed in the first electrode formation step, and then performing patterning on the organic layer formation film by etching to form an organic layer, and a second electrode formation step of forming a second electrode formation film on an entire surface of the support base member to cover the organic layer formed in the organic layer formation step, and then performing patterning on the second electrode formation film by etching to form a second electrode.

With this method, the first electrode, the organic layer, and the second electrode are each formed by forming a formation film therefore on an entire surface of the support base member and then performing patterning on the formation film by etching. Therefore, the organic electric-field element can be easily manufactured without using a mask, such as a deposition mask, a metal mask, etc.

In this case, the first electrode formation step, the organic layer formation step, and the second electrode formation step are preferably performed on the support base member which is conveyed in roll-to-roll processing.

With this method, the electrodes and the organic layer can be continuously formed in a single formation chamber, leading to a simpler manufacturing process and a smaller manufacturing apparatus.

A method for manufacturing the organic electronic device of the present invention includes a testing step of, after the plurality of organic electric-field elements are formed and before the plurality of organic electric-field elements are attached to one of the substrates, removing a defective one or ones of the plurality of organic electric-field elements.

With this method, before the organic electric-field elements are attached to the substrate, testing is performed to determine whether or not each organic electric-field element is defective, whereby removing the defective product(s). Therefore, the yield of organic electronic devices is improved.

With this configuration, in the organic electric-field element, at one end portion of the support base member, a two-layer structure region including the support base member and the first electrode is provided, and a three-layer structure region including the support base member, the first electrode, and the organic layer is provided, extending continuously from the other end of the two-layer structure region. At the other end portion of the support base member, a two-layer structure region including the support base member and the second electrode is provided, and a three-layer structure region including the support base member, the second electrode, and the organic layer is provided, extending continuously from one end of the two-layer structure region. The first electrode, the organic layer, and the second electrode each have a rectangular pattern having a width which is equal to the width of the support base member and a predetermined length in the length direction of the support base member. Therefore, complicated patterning is not required for formation of the first electrode, the organic layer, and the second electrode. Therefore, each formation step only requires forming a formation film on an entire surface and then etching the formation film without using a mask. Thus, the organic electric-field element can be easily manufactured.

BRIEF DESCRIPTION OF THE DRAWINGS

FIG. 1 is a perspective view schematically showing an organic electronic device (organic EL device) according to a first embodiment.

FIGS. 2(a)-2(e) are diagrams for describing a method for manufacturing the organic electric-field element.

[FIG. 3] FIGS. 3(a)-3(e) are diagrams for describing a method for manufacturing the organic electric-field element using roll-to-roll processing.

FIG. 4 is a perspective view schematically showing an organic electronic device according to another embodiment.

DETAILED DESCRIPTION OF THE INVENTION

First Embodiment

<Organic EL Device>

Figure 1:
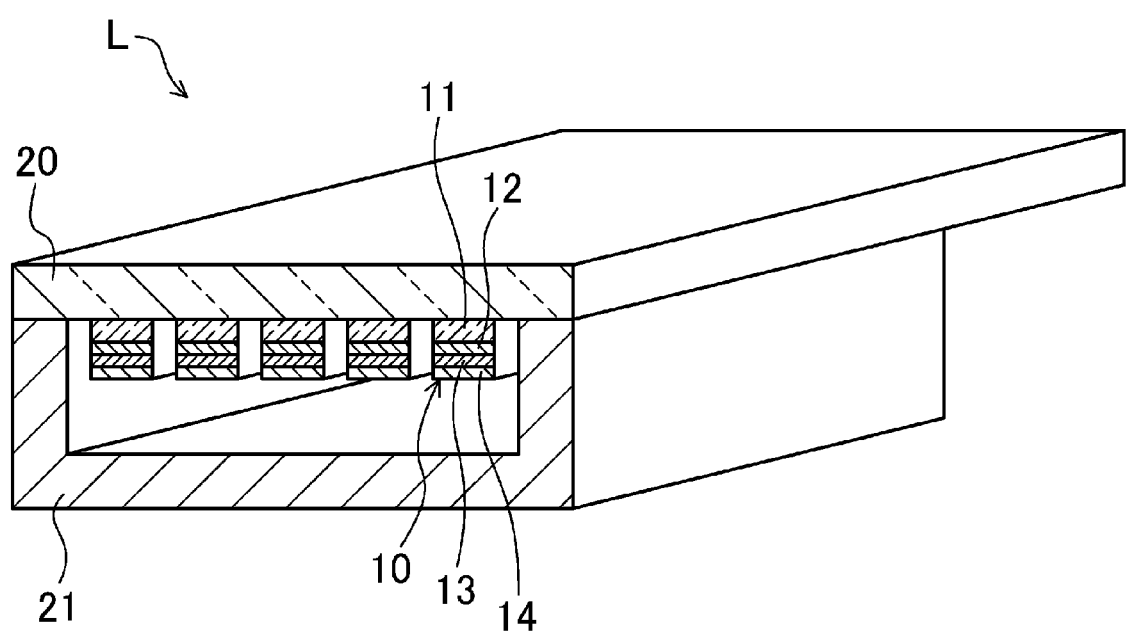
[FIG. 1]
Figure 2:
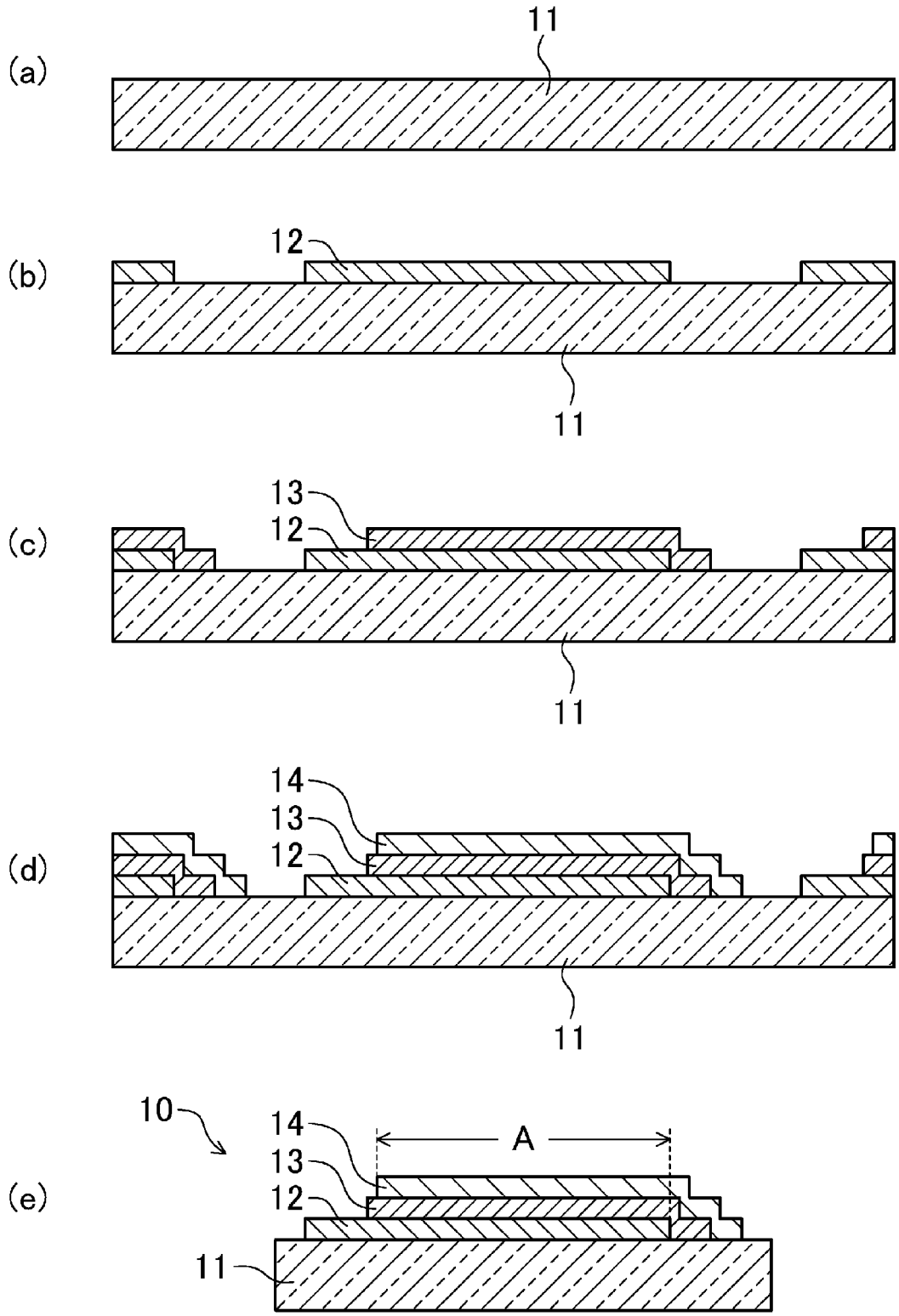
[FIG. 2]

FIGS. 1 and 2 show an organic electronic device according to a first embodiment. The organic electronic device is an organic EL device L including an organic layer 13 made of a luminescent material. The organic EL device L is, for example, an organic EL illuminating device which is used to illuminate a room or serve as a backlight for a liquid crystal display device.

In the organic EL device L, a first substrate 20 and a second substrate 21 are arranged to face each other, and a plurality of organic EL elements 10 are interposed therebetween.

The organic EL element 10 includes a first electrode 12, the organic EL layer 13, and a second electrode 14, which are stacked on a support base member 11.

The support base member 11 includes a plastic film made of, for example, a styrene resin, an acrylic resin, polyethylene telephthalate resin (PET), polyethylene naphthalate resin (PEN), or polybutylene telephthalate resin (PBT), etc. The support base member 11 is in the shape of, for example, a tape having a width of about 1 cm, a length of about 15 cm, and a thickness of about 0.2 mm. The support base member 11 is preferably made of a flexible material whose shape can be changed, depending on a shape of an object to be fixed thereto.

The first electrode 12 and the second electrode 14 may be an anode and a cathode, respectively, or vice versa. While holes are injected from the anode into the organic EL layer 13, electrons are injected from the cathode into the organic EL layer 13.

The anode is preferably made of a material having a high work function in order to enhance the efficiency of injecting holes into the organic EL layer 13. For example, the anode is preferably a transparent electrode made of a metal (e.g., Au, Ag, etc.) or ITO, etc.

The cathode is preferably made of a material having a low work function in order to enhance the efficiency of injecting electrons into the organic EL layer 13. The cathode may be, for example, formed of: a multilayer structure of a metal having a low work function and a stable metal, such as Ca/Al, Ce/Al, etc.; an alloy, such as Ca:Al alloy, Mg:Ag alloy, etc.; a multilayer structure of a thin insulating film and a metal electrode, such as LiF/Al etc.; etc.

For example, when the first electrode 12 is the anode and the second electrode 14 is the cathode, a reinforcement electrode made of, for example, an aluminum film may be provided at an end portion of a pattern in which the first electrode 12 is formed. The reinforcement electrode has a thickness of, for example, about 100 nm. The reinforcement electrode can reduce a voltage drop caused by the resistance of the electrode, whereby emission unevenness can be reduced or eliminated.

The organic EL layer 13 includes at least an emitting layer. The organic EL layer 13 may have a three-layer structure in which a hole transport layer, the emitting layer, and an electron transport layer are stacked together, or a five-layer structure in which a hole injection layer, a hole transport layer, the emitting layer, an electron transport layer, and an electron injection layer are stacked together, or a six-layer structure in which a hole injection layer, a hole transport layer, an electron blocking layer, the emitting layer, a hole blocking layer, and an electron injection layer are stacked together.

The hole injection layer and the hole transport layer have a function of efficiently injecting and transporting holes received from the anode to the emitting layer. Examples of a material for hole injection and transportation include aromatic tertiary amines, such as 4,4'-bis[N-(1-naphtyl)-N-phenylamino]biphenyl (α-NPD), N,N'-di(naphthalene-1-yl)-N,N'-diphenylbenzidine (NPD), etc., represented by:

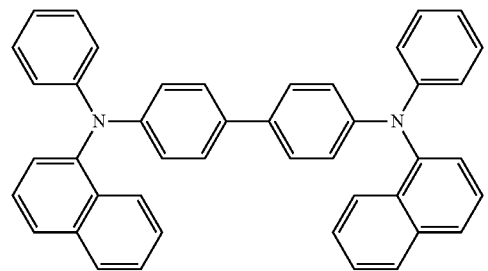 [SMILES: c1ccc(N(c2ccc(-c3ccc(N(c4ccccc4)c4cccc5ccccc45)cc3)cc2)c2cccc3ccccc23)cc1]

The hole injection layer and the hole transport layer have a thickness of, for example, about 30 nm and about 20 nm, respectively.

An electron blocking material for the electron blocking layer may be similar to the hole injection material. The electron blocking layer has a thickness of, for example, about 10 nm.

The emitting layer is made of a luminescent material doped with a dopant. Examples of the luminescent material include carbazole derivatives (e.g., 4,4'-bis(carbazole-9-yl)-biphenyl (CBP) etc.), triazole derivatives (e.g., 2,4-triazole etc.), etc., represented by:

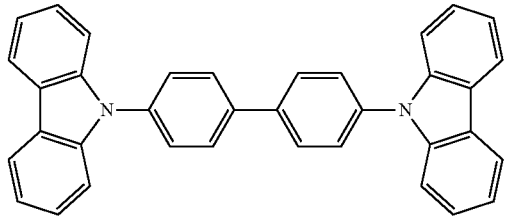 [SMILES: c1ccc2c(c1)c1ccccc1n2-c1ccc(-c2ccc(-n3c4ccccc4c4ccccc43)cc2)cc1]

Examples of the dopant include (2-phenylpyridine)iridium (Ir(ppy)$_3$) (green dopant) represented by:

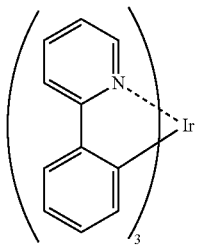

iridium(III)bis(4',6'-difluorophenyl)-pyridinato-N,C2]picolinate (FIr(pic)) (blue dopant) represented by:

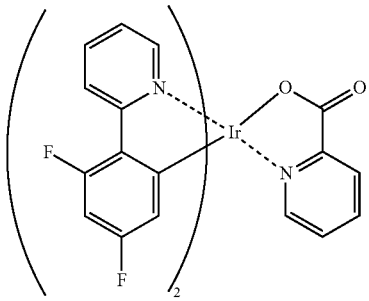

bis(2-(2'-benzo[4,5-a]thienyl)-pyridinato-N,C3')iridium (acetylacetonate) ((Btp)$_2$Ir(acac)) (red dopant) represented by:

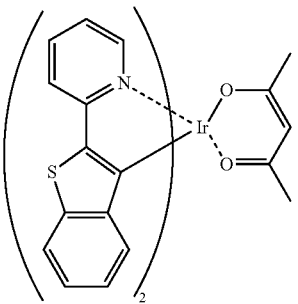

These dopants are injected in an amount of, for example, about 6 mass % relative to the luminescent material. The emitting layer has a thickness of, for example, about 30 nm.

Note that a green emitting layer, a blue emitting layer, and a red emitting layer doped with a green dopant, a blue dopant, and a red dopant, respectively, may be stacked together, whereby white light is obtained by mixing green, blue, and red light.

The hole blocking layer has a function of blocking holes from moving to the cathode. An example of the hole blocking material is 2,9-dimethyl-4,7-diphenyl-1,10-phenanthroline (BCP) represented by:

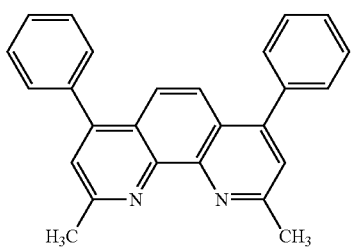 [SMILES: Cc1cc(-c2ccccc2)c2ccc3c(-c4ccccc4)cc(C)nc3c2n1]

The hole blocking layer has a thickness of, for example, about 10 nm.

The electron injection layer and the electron transport layer have a function of efficiently injecting and transporting electrons received from the cathode to the emitting layer. An example of a material for electron injection and transportation is tris(8-quinolinyloxy) aluminum (Alq3) represented by:

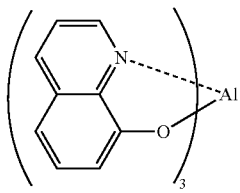

The electron transport layer and the electron injection layer have a thickness of, for example, about 30 nm and about 1 nm, respectively.

Here, a relationship between the shapes of the first electrode 12, the organic layer 13, and the second electrode 14 which have been patterned will be described. The first electrode 12, the organic layer 13, and the second electrode 14 each have a predetermined length corresponding to an emitting region A, and a width which is equal to a width of the support base member 11, i.e., are each patterned into substantially a rectangular shape.

At one end in the length direction of the support base member 11, the ends of the support base member 11, the first electrode 12, the organic layer 13, and the second electrode 14 are sequentially arranged in parallel with each other as viewed from above. In other words, a region between the end of the first electrode 12 and the end of the organic layer 13 is a two-layer structure region where the support base member 11 and the first electrode 12 are stacked together, and a region between the end of the organic layer 13 and the end of the second electrode 14 is a three-layer structure region where the support base member 11, the first electrode 12, and the organic layer 13 are stacked together.

On the other hand, at the other end in the length direction of the support base member 11, the ends of the support base member 11, the second electrode 14, the organic layer 13, and the first electrode 12 are sequentially arranged in parallel with each other as viewed from above. In other words, a region between the end of the second electrode 14 and the end of the organic layer 13 is a two-layer structure region where the support base member 11 and the second electrode 14 are stacked together, and a region between the end of the organic layer 13 and the end of the second electrode 14 is a three-layer structure region where the support base member 11, the organic layer 13, and the second electrode 14 are stacked together.

The first electrode 12, the organic layer 13, and the second electrode 14 are formed and positioned as described above, so that an upper portion of the first electrode 12 is exposed in the two-layer structure region at one end while an upper portion of the second electrode 14 is exposed at the other end. As a result, a voltage can be applied between the first electrode 12 and the second electrode 14 without providing a contact hole etc. on the support base member 11.

A protection film may be provided to cover the second electrode 14, whereby external moisture etc. entering the organic EL layer 13 can be reduced or prevented. An example of a material for the protection film is an insulating inorganic film made of SiON, SiO, or SiN, etc.

A plurality of the organic EL elements 10 are provided in a space formed by the first substrate 20 and the second substrate 21, and are connected to an extraction terminal of the first substrate 20 so that the organic EL elements 10 are electrically connected together in parallel.

The first substrate 20 and the second substrate 21 are made of a transparent material, such as glass, resin, etc. The first substrate 20 and the second substrate 21 may be in the shape of a planar plate or may have a shape with a curved surface. Note that if one of the first substrate 20 and the second substrate 21 is made of a transparent material, the other substrate may not be transparent and may be made of, for example, a metal material. The first substrate 20 and the second substrate 21 may each have, for example, a length of about 100 mm, a width of about 100 mm, and a thickness of about 0.7 mm. The first substrate 20 and the second substrate 21 are arranged to face each other and sandwich the organic EL elements 10. The first substrate 20 and the second substrate 21 are sealed using a UV curable resin etc. to encapsulate the organic EL elements 10. A space formed by the first substrate 20 and the second substrate 21 is adjusted to an inert gas atmosphere (e.g., nitrogen, argon, etc.) or a vacuum atmosphere, whereby damage to the organic EL element 10 due to moisture or oxygen is reduced or prevented. The space formed by the first substrate 20 and the second substrate 21 may additionally contain, for example, a moisture absorbent, such as barium oxide etc. Note that the space formed by the first substrate 20 and the second substrate 21 may be filled with, for example, a heat dissipating resin having a high heat conductivity. Examples of the heat dissipating resin material include an insulating acrylic rubber, ethylene propylene rubber, etc. The high-heat-conductivity heat dissipating resin allows heat to efficiently escape to the outside and be more uniformly distributed in a plane.

The organic EL elements 10 are spaced apart from each other and arranged side by side in the width direction. A space between each organic EL element 10 is, for example, about 5 mm.

The anodes of the organic EL elements 10 may be connected together and the cathodes of the organic EL elements 10 may be connected together. In this case, each organic EL element 10 can be easily connected to an external power supply.

In the organic EL illuminating device 10 thus configured, when a voltage is applied between the first electrode 12 and the second electrode 14, holes are injected into the emitting layer from the anode one of the first electrode 12 and the second electrode 14 and electrons are injected into the emitting layer from the cathode one of the first electrode 12 and the second electrode 14. The hole and the electron are recombined in the emitting layer to emit energy, which in turn excites the luminescent material of the emitting layer. When the excited luminescent material returns from the excited state to the ground state, fluorescent light or phosphorescent light is released and emitted to the outside.

<Method for Manufacturing Organic EL Device>

Next, a method for manufacturing the organic EL device L will be described.

Initially, a film tape which will be used as the support base member 11 of the organic EL element 10 is prepared. The film tape has, for example, a width of about 10 mm and a length of about 10 m. The film tape will be cut into pieces each having a length of, for example, 15 cm, which is a size of the organic EL element 10. Note that a series of manufacturing steps described below are performed in an inert gas atmosphere (e.g., nitrogen, argon, etc.) in a glovebox etc.

Next, the support base member 11 is attached to a roll-to-roll vapor deposition device 30 shown in FIG. 3(a). The roll-to-roll vapor deposition device 30 includes, between two rolls R for winding the film tape, a cleaning section 31, a first electrode film formation section 32, an etching section 33, an organic layer formation section 34, an etching section 35, a second electrode film formation section 36, an etching section 37, a protection film formation section 38, and an etching section 39. The film formation sections 32, 34, 36, and 38 are each means for forming a layer by vapor deposition.

Initially, the cleaning section 31 performs microwave plasma dry cleaning on a surface of the film tape.

(First Electrode Formation Step)

Next, the first electrode film formation section 32 forms, for example, an ITO film on an entire surface of the support base member 11. Thereafter, the etching section 33 etches the ITO film to form the first electrode 12. In this case, for example, the etching is performed so that the first electrode 12 has a rectangular pattern shape having a width which is equal to the width of the film tape and a predetermined length in the length direction of the film tape. In this etching, patterning is performed so that the first electrode 12 has a rectangular pattern shape having a width which is equal to the width of the film tape and a predetermined length in the length direction of the film tape, and therefore, a mask is not required.

(Organic Layer Formation Step)

Next, the organic layer formation section 34 forms the organic layer 13 on an entire surface of the first electrode 12. Thereafter, the etching section 35 performs patterning on the organic layer 13. In this case, the organic layer 13 is patterned to cover a pattern in which the first electrode 12 has been formed, with one end of the organic layer 13 being located on the first electrode 12 so that a corresponding end portion of the first electrode 12 which has a predetermined length in the length direction of the film tape is left uncovered, and the other end of the organic layer 13 being located on the film tape to cover a corresponding end portion of the first electrode 12. As a result, at one end portion, a region between the end of the first electrode 12 and the end of the organic layer 13 has a two-layer structure in which the support base member 11 and the first electrode 12 are stacked together. In this etching, patterning is performed so that the organic layer 13 has a rectangular pattern shape having a width which is equal to the width of the film tape and a predetermined length in the length direction of the film tape, and therefore, a mask is not required.

(Second Electrode Formation Step)

Next, the second electrode film formation section 36 forms the second electrode 14 on an entire surface of the organic layer 13. Thereafter, the etching section 37 performs patterning on the second electrode 14. In this case, the second electrode 14 is patterned to cover a pattern in which the first electrode 12 and the organic layer 13 have been formed, with one end of the second electrode 14 being provided on the organic layer 13 so that a corresponding end portion of the organic layer 13 which has a predetermined length in the length direction of the film tape is left uncovered, and the other end of the second electrode 14 being located on the film tape to cover a corresponding end portion of the organic layer 13.

As a result, at one end portion, a region between the end of the organic layer 13 and the end of the second electrode 14 has a three-layer structure in which the support base member 11, the first electrode 12, and the organic layer 13 are stacked together. At the other end portion, a region between the end of the first electrode 12 and the end of the organic layer 13 has a three-layer structure in which the support base member 11, the first electrode 12, and the organic layer 13 are stacked together, and a region between the end of the organic layer 13 and the end of the second electrode 14 has a two-layer structure in which the support base member 11 and the first electrode 12 are stacked together. In this etching, patterning is performed so that the second electrode 14 has a rectangular pattern shape having a width which is equal to the width of the film tape and a predetermined length in the length direction of the film tape, and therefore, a mask is not required.

Moreover, the protection film formation section 38 forms a protection film made of, for example, $SiO_2$, to cover the second electrode 14. Thereafter, the etching section 39 performs patterning on the protection film.

The film tape on which the first electrode 12, the organic layer 13, the second electrode 14, and the protection film have been thus formed is wound around a roll R. Thereafter, as shown in FIG. 3(b), the film tape is cut into pieces each having a predetermined length, where each piece is the organic EL element 10.

(Testing Step)

Next, the fabricated organic EL elements 10 are tested using a known technique. Thereafter, as shown in FIG. 3(c), a defective product(s) is removed, and as shown in FIG. 3(d), non-defective organic EL elements 10 are fixed to the first substrate 20 using a transparent thermosetting resin etc., and the organic EL elements 10 are electrically connected to the extraction terminal of the first substrate 20. In this case, the organic EL elements 10 are spaced apart from each other, where a space between each organic EL element 10 is about 1-5 mm.

After the organic EL elements 10 are fixed onto the first substrate 20, as shown in FIG. 3(e) the second substrate 21 is stacked on the first substrate 20 to cover the organic EL elements 10, and the resultant structure is sealed using a UV curable resin etc. Thus, the organic EL device L of this embodiment can be fabricated.

Although a roll-to-roll vapor deposition device is used to fabricate the organic EL elements 10 in the above description, the organic EL elements 10 may be fabricated using, for example, a single-wafer processing device including separate chambers for different steps of forming the electrodes and the organic layer 13 instead of the roll-to-roll vapor deposition device.

Other Embodiments

Figure 4:
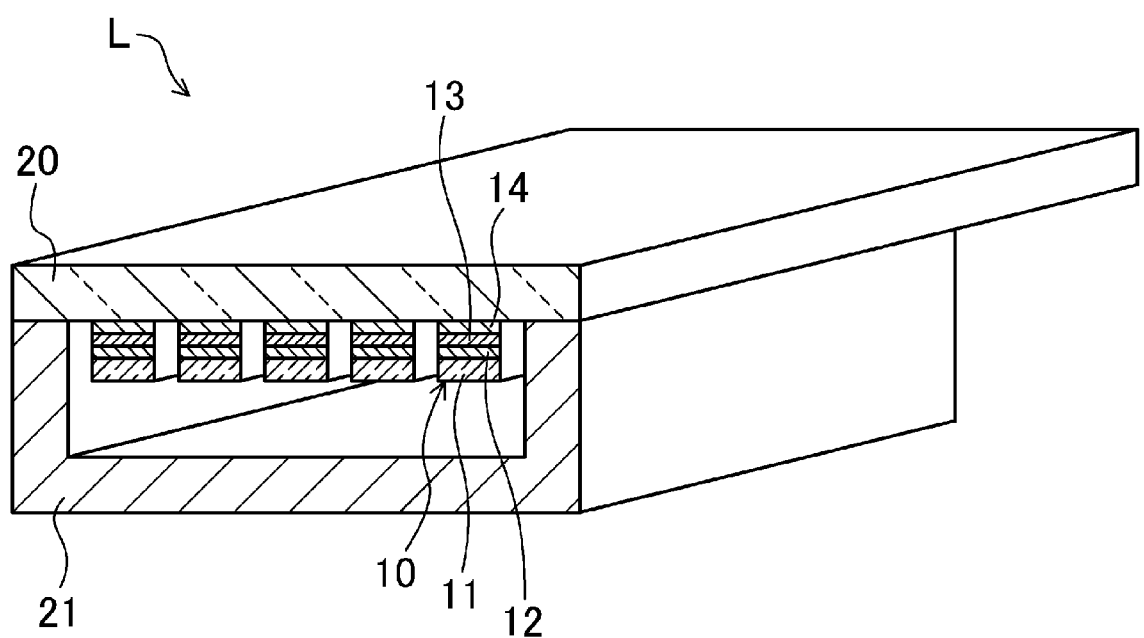
[FIG. 4]

In the first embodiment, the organic electric-field element is attached to the first substrate 20 with the support substrate thereof contacting the first substrate 20. Alternatively, as shown in FIG. 4, the organic electric-field element may be attached to the first substrate 20 with the second electrode 14 thereof contacting the first substrate 20.

In the first embodiment, as an organic electronic device including an organic electric-field element, the organic EL device L including the organic EL element 10 whose organic layer 13 is made of a luminescent material has been described. An organic electronic device having a similar configuration is applicable to an organic photovoltaic cell including a photoelectric conversion element whose organic layer is formed of a photoelectric conversion material, and an organic field-effect transistor including an organic field-effect transistor element whose organic layer is formed of a semiconductor material.

The present invention is useful for organic elements (e.g., organic EL elements, organic photovoltaic cell elements, organic field-effect transistor elements, etc.), organic devices including organic elements (e.g., organic EL devices, organic photovoltaic cells, organic field-effect transistors, etc.), and methods for manufacturing organic elements.

The invention claimed is:

1. An organic electronic device comprising:
    a plurality of organic electroluminescent elements, each comprising,
        an elongated support base member;
        a first electrode provided on the support base member;
        an organic layer provided to cover the first electrode; and
        a second electrode provided to cover the organic layer, wherein
        at one end portion of the support base member, a two-layer structure region including the support base member and the first electrode is provided, and a three-layer structure region including the support base member, the first electrode, and the organic layer is provided, extending continuously from the other end of the two-layer structure region,
        at the other end portion of the support base member, a two-layer structure region including the support base member and the second electrode is provided, and a three-layer structure region including the support base member, the second electrode, and the organic layer is provided, extending continuously from one end of the two-layer structure region toward the one end portion of the support base member,
    the plurality of organic electroluminescent elements are provided and encapsulated between a pair of substrates facing each other, and
    the plurality of the organic electroluminescent elements are electrically connected together in parallel.

2. The organic electronic device of claim 1, wherein at least one of the pair of substrates is made of an optically transparent material.

3. The organic electronic device of claim 1, wherein
    each of the plurality of organic electroluminescent elements is attached to one of the pair of substrates with the second electrode thereof contacting the one of the pair of substrates.

4. The organic electronic device of claim 1, wherein
    each of the plurality of organic electroluminescent elements is attached to one of the pair of substrates with the support base member thereof contacting the one of the pair of substrates.

5. The organic electronic device of claim 1, wherein
    a space formed between the pair of substrates is filled with a heat dissipating resin having a higher heat conductivity than that of the air.

6. A method for manufacturing an organic electronic device including a plurality of organic electroluminescent elements including
    an elongated support base member,
    a first electrode provided on the support base member,
    an organic layer provided to cover the first electrode, and
    a second electrode provided to cover the organic layer,
    at one end portion of the support base member, a two-layer structure region including the support base member and the first electrode being provided, and a three-layer structure region including the support base member, the first electrode, and the organic layer being provided,
    at the other end portion of the support base member, a two-layer structure region including the support base member and the second electrode being provided, and a three-layer structure region including the support base member, the second electrode, and the organic layer being provided,
    the plurality of organic electroluminescent elements being provided and encapsulated between a pair of substrates facing each other, and the plurality of the organic electroluminescent elements being electrically connected together in parallel, the method comprising:

a formation step of manufacturing the plurality of organic electroluminescent elements including a first electrode formation step of forming a first electrode formation film on an entire surface of a support base member, and then performing patterning on the first electrode formation film by etching to form a first electrode, an organic layer formation step of forming an organic layer formation film on an entire surface of the support base member to cover the first electrode formed in the first electrode formation step, and then performing patterning on the organic layer formation film by etching to form an organic layer, a second electrode formation step of forming a second electrode formation film on an entire surface of the support base member to cover the organic layer formed in the organic layer formation step, and then performing patterning on the second electrode formation film by etching to form a second electrode, the first electrode formation step, the organic layer formation step, and the second electrode formation step being performed on a plastic film which has a tape shape and which is conveyed in roll-to-roll processing, and a cutting step of cutting the plastic film into pieces each having a predetermined length as the support base member; and a step of providing the plurality of organic electroluminescent elements in a space between the pair of the substrates facing each other and encapsulating the space.

7. The method of manufacturing the organic electronic device of claim 6, comprising:

a testing step of, after the plurality of organic electroluminescent elements are formed and before the plurality of organic electroluminescent elements are attached to one of the substrates, removing a defective one or ones of the plurality of organic electroluminescent elements.

8. The organic electronic device of claim 1, wherein the support base member is a plastic film having a thickness of 0.02-0.5 mm.

9. The organic electronic device of claim 1, wherein at least one of the pair of substrates is a glass substrate or a resin substrate having a thickness of 0.4-1.5 mm.

10. The organic electronic device of claim 1, wherein in the support base member, a length from the one end portion to the other end portion thereof in a length direction thereof is 100-300 mm, and a length in a width direction thereof is 5-20 mm.

11. The organic electronic device of claim 1, wherein the pair of substrates have a rectangular shape with one side of 50-300 mm.

12. The organic electronic device of claim 1, wherein the plurality of organic electroluminescent elements are disposed such that an interval between adjacent ones of the plurality of organic electroluminescent elements is 1-5 mm.

13. The organic electronic device of claim 1, wherein the first electrode extends along a length direction of the support base member to have a width equal to a width of the support base member;

the organic layer extends along the length direction of the support base member to have a width equal to the width of the support base member; and the second electrode extends along the length direction of the support base member to have a width equal to the width of the support base member.

14. The organic electronic device of claim 1, wherein the first electrode is an anode, the second electrode is a cathode, and an element made of aluminum is provided at an end portion of the first electrode.

15. The organic electronic device of claim 1, wherein the plurality of organic electroluminescent elements are spaced apart from each other and arranged side by side in a width direction of the organic electroluminescent elements, and the first electrodes of the organic electroluminescent elements are connected together, and the second electrodes of the organic electroluminescent elements are connected together.

16. The method of claim 6, wherein in each of the organic electroluminescent elements, the first electrode extends along a length direction of the support base member to have a width equal to a width of the support base member, the organic layer extends along the length direction of the support base member to have a width equal to the width of the support base member, and the second electrode extends along the length direction of the support base member to have a width equal to the width of the support base member, the plastic film is made of multiple ones of the support base member which lie in contact with each other in a row in a length direction of the support base members, and in the cutting step, the plastic film is cut to a predetermined length to obtain the plurality of support base members.

* * * * *